US009096395B2

(12) United States Patent
Wakabayashi

(10) Patent No.: US 9,096,395 B2
(45) Date of Patent: Aug. 4, 2015

(54) ELECTRIC ACTUATOR

(75) Inventor: Shinji Wakabayashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 65 days.

(21) Appl. No.: 14/122,774

(22) PCT Filed: Jun. 18, 2012

(86) PCT No.: PCT/JP2012/066089
§ 371 (c)(1),
(2), (4) Date: Nov. 27, 2013

(87) PCT Pub. No.: WO2012/176913
PCT Pub. Date: Dec. 27, 2012

(65) Prior Publication Data

US 2014/0110224 A1 Apr. 24, 2014

(30) Foreign Application Priority Data

Jun. 24, 2011 (JP) ................................ 2011-140460

(51) Int. Cl.
*B65G 45/10* (2006.01)
*B65G 49/07* (2006.01)
(Continued)

(52) U.S. Cl.
CPC ................ *B65G 54/02* (2013.01); *B65G 45/10* (2013.01); *B65G 49/07* (2013.01); *H01L 21/67742* (2013.01); *Y10T 74/18712* (2015.01)

(58) Field of Classification Search
CPC ............ H01L 21/677; H01L 21/67703; H01L 21/67706; H01L 21/67742; H01L 21/67748; H01L 21/67751; B65G 45/10; B65G 49/07; B65G 54/02; Y10T 74/18712; Y10T 74/1872
USPC ............ 198/493–495, 339.1, 346.1; 74/89.2, 74/89.4, 89.41, 89.32, 89.33
See application file for complete search history.

(56) References Cited

U.S. PATENT DOCUMENTS 5,410,922 A * 5/1995 Katahira ........................ 74/89.4
5,915,916 A * 6/1999 Saji ........................... 414/749.1
(Continued)

FOREIGN PATENT DOCUMENTS

JP 8-290384 A 11/1996
JP 2000-197304 A 7/2000
(Continued)

OTHER PUBLICATIONS

"Electric Actuator Slider Type," [online], SMC Corporation, [searched on May 13, 2011], Internet (URL:http://www.smcworld.com/new/pdf/S100-87B-LEF.pdf), pp. 8, 13, and its English translation (6 pages).

(Continued)

*Primary Examiner* — Mark A Deuble
(74) *Attorney, Agent, or Firm* — Rothwell, Figg, Ernst & Manbeck, P.C.

(57) ABSTRACT

Provided is an electric actuator capable of preventing the release of particles from the body thereof. The electric actuator includes a body made of an elongated enclosure; a slider configured to move in a reciprocating manner along a lengthwise direction of the body; an opening formed in a side surface of the body to correspond to a moving path of the slider; a dust seal band provided to cover the opening; and a pair of electrodes protruding from the body at opposite sides of the opening toward the outside of the body and extending in the lengthwise direction of the body with the opening being interposed between the pair of electrodes. Positive potential is generated in the upper electrode of the pair of electrodes and negative potential is generated in the lower electrode of the pair of electrodes.

7 Claims, 8 Drawing Sheets

10
C
11
14 13 12
C

(51) Int. Cl.
*H01L 21/677* (2006.01)
*B65G 54/02* (2006.01)

(56) References Cited

U.S. PATENT DOCUMENTS

| | | | | |
|---|---|---|---|---|
| 6,241,230 | B1 * | 6/2001 | Kawaguchi | 269/73 |
| 6,571,932 | B1 | 6/2003 | Kawashima et al. | |
| 6,749,057 | B2 * | 6/2004 | Kato | 198/750.7 |
| 6,832,680 | B1 * | 12/2004 | Matsumura | 198/495 |
| 6,935,828 | B2 * | 8/2005 | Ackeret et al. | 414/217 |
| 2003/0121759 | A1 | 7/2003 | Kawashima et al. | |
| 2005/0252319 | A1 | 11/2005 | Kato | |
| 2010/0236405 | A1 | 9/2010 | Yamawaku et al. | |

FOREIGN PATENT DOCUMENTS

| | | | |
|---|---|---|---|
| JP | 2002-353086 | A | 12/2002 |
| JP | 2005-321062 | A | 11/2005 |
| JP | 2008-211018 | A | 9/2008 |
| JP | 2010-225641 | A | 10/2010 |

OTHER PUBLICATIONS

International Search Report mailed Sep. 18, 2012 in PCT/JP2012/066089.

* cited by examiner

ELECTRIC ACTUATOR

CROSS REFERENCE TO RELATED APPLICATION

This application is a 35 U.S.C. 371 National Phase Entry Application from PCT/JP2012/066089, filed Jun. 18, 2012, which claims the benefit of Japanese Patent Application No. 2011-140460, filed Jun. 24, 2011, the disclosures of which are incorporated herein in their entirety by reference.

TECHNICAL FIELD

The present disclosure relates to an electric actuator provided with a slider which reciprocates in a direction.

BACKGROUND ART

In a substrate processing apparatus that performs a predetermined processing on a substrate such as, for example, a semiconductor wafer (hereinafter, simply referred to as "wafer"), an electric actuator is used when moving the wafer linearly within the substrate processing apparatus.

FIGS. 8A to 8C are views schematically illustrating a configuration of a conventional electric actuator used in a substrate processing apparatus in which FIG. 8A is a front view, FIG. 8B is a bottom view, and FIG. 8C is a cross-sectional view taken along line C-C in FIG. 8A.

In the electric actuator 80, a planar slider 82 is moved along the lengthwise direction of a body 81 of the electric actuator 80 which is formed in an elongated rectangular parallelepiped shape, in a reciprocating manner as indicated white arrows in the drawings. The slider 82 is joined to a guide 84 through a bracket 85 and the guide 84 is engaged with a rail 83 arranged within the body 81. When the guide 84 is driven along the rail 83 by a belt 86, the slider 82 is moved together with the guide 84. The slider 82 is formed with a plurality of screw holes 87 and a pick (not illustrated) on which, for example, a wafer is placed is attached to the slider 82 by screwing clamping screws (not illustrated) to the respective screw holes 87. The wafer is moved by moving the slider 82.

An opening 88 is formed in a side surface of the body 81 of the electric actuator 80 along the lengthwise direction of the body 81 in order to enable the slider 82 or the bracket 85 to move along the lengthwise direction of the body 81. However, a greater part of the opening 88 is covered by a dust seal band 89. The dust seal band 89 prevents particles generated by friction when the guide 84 is driven on the rail 83 from being released to the outside of the body 81. See, for example, Non-Patent Document 1.

PRIOR ART DOCUMENT

Non-Patent Document

Non-Patent Document 1: "Electric Actuator Slider Type", p. 8, 13, [online], SMC Corporation, [searched on May 13, 2011], Internet (URL:http://www.smcworld.com/new/pdf/S100-87B-LEF.pdf)

DISCLOSURE OF THE INVENTION

Problems to be Solved

In the electric actuator 82 as described above, however, a clearance generated in the opening 88, specifically, clearances 90 between the body 81 and the dust seal band 89 have a width of scores of micrometers. Therefore, particles P having a grain size of scores of nanometers may be released to the outside of the body 81 through the clearance 90, as illustrated in FIG. 9.

Meanwhile, micronization of processings in a wafer have been advanced recently and thus, it becomes required to form, for example, a trench having a width of scores of nanometers or a hole having a diameter of scores of nanometers on a surface of a wafer by an etching. Thus, when particles P having a grain size of scores of nanometers that have passed through the clearances 90 are adhered to the surface of the wafer, they may cause a defect of a semiconductor device fabricated from the wafer. Accordingly, it is required to suppress the particles P having the grain size of scores of nanometers which have passed through the clearances 90 from being adhered to the surface of the wafer by being released from the electric actuator 82.

An object of the present disclosure is to provide an electric actuator capable of suppressing a particle from being released from a body of the electric actuator.

Means to Solve the Problems

In order to achieve the object as described above, the present disclosure provides an electric actuator including: a body made of an elongated enclosure; a base portion configured to move in a reciprocating manner along a lengthwise direction of the body; an opening formed in a side surface of the body to correspond to a moving path of the base portion; a seal member provided to cover the opening; and a pair of electrodes protruding from the body at the opposite sides of the opening toward the outside of the body and extending in the lengthwise direction of the body with the opening being interposed between the pair of electrodes. Positive potential is generated in one of the pair of electrodes and negative potential is generated in the other of the pair of electrodes.

In the present disclosure, it is desirable that the internal pressure of the body is maintained to be higher than the external pressure of the body.

In the present disclosure, it is desirable that the base portion has a protrusion that protrudes to the outside of the body and has at least one curved location, and the pair of electrodes are curved along the protrusion with the protrusion being interposed therebetween.

In the present disclosure, it is desirable that the opening is opened upwardly.

In the present disclosure, it is desirable that a substrate conveyance apparatus configured to convey a substrate is attached to the base portion.

In the present disclosure, it is desirable that an insulation member is interposed between the pair of electrodes and the body and the pair of electrodes are electrically insulated from the body.

In the present disclosure, it is desirable that the seal member is a seal band.

Effect of the Invention

According to the present disclosure, in the pair of electrodes protruding from the body at opposite sides of the opening formed in a side surface of the body toward the outside of the body and extending in the lengthwise direction of the body with the opening being interposed between the pair of electrodes, positive potential is generated in one of the pair of electrodes and negative potential is generated in the other of the pair of electrodes. Therefore, a charged particle released from the inside of the body through the opening and the clearance of the seal band to the outside of the body is adsorbed by electrostatic force to an electrode having a potential of which the pole is opposite to that of the charge of the charged particle is generated. As a result, the release of the charged particle from the body may be suppressed.

DETAILED DESCRIPTION TO EXECUTE THE INVENTION

Hereinafter, exemplary embodiments of the present disclosure will be described with reference to the accompanying drawings.

First, descriptions will be made on an electric actuator according to a first exemplary embodiment of the present disclosure.

Figure 1A:
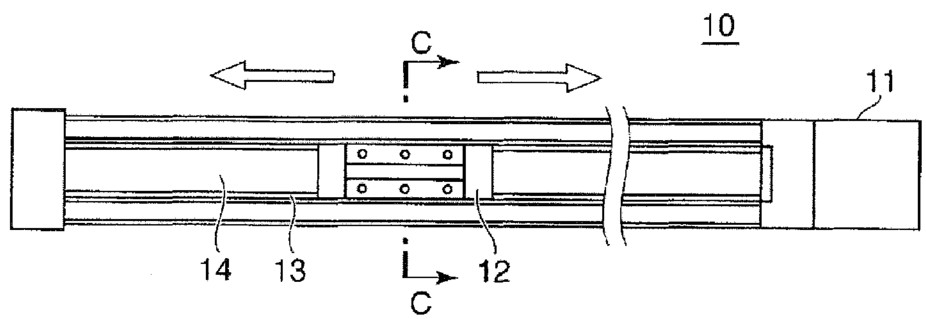
FIG. 1A is a front view schematically illustrating a configuration of an electric actuator according to a first exemplary embodiment of the present disclosure when viewed from the front side.
Figure 1B:
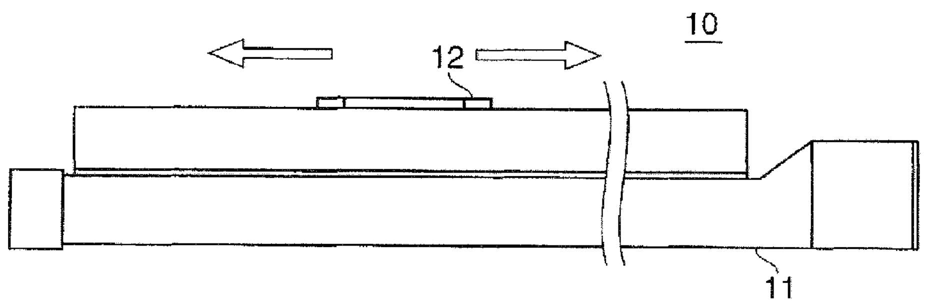
FIG. 1B is a bottom view schematically illustrating a configuration of the electric actuator according to the exemplary embodiment when viewed from the bottom side.
Figure 1C:
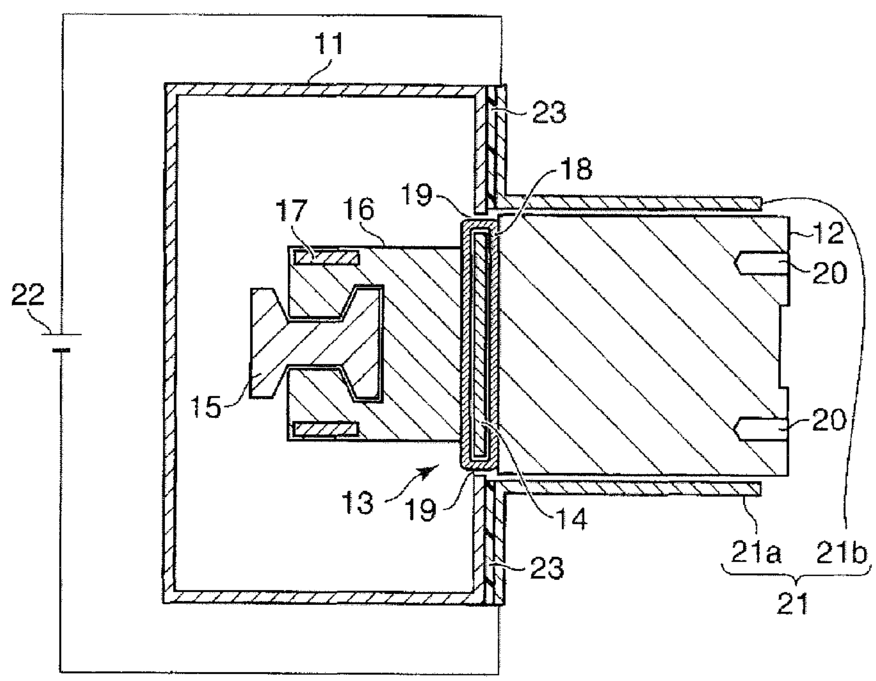
FIG. 1C is a schematic cross-sectional view taken along line C-C in FIG. 1A in the configuration of the electric actuator according to the first exemplary embodiment.

FIGS. 1A to 1C are views schematically illustrating a configuration of the electric actuator according to the first exemplary embodiment of the present disclosure in which FIG. 1A is a front view, FIG. 1B is a bottom view, and FIG. 1C is a cross-sectional view taken along line C-C in FIG. 1A.

The electric actuator 10 includes a body 11 formed in an elongated rectangular parallelepiped shape, a slider 12 (base portion) of a substantially rectangular pallalelepiped shape which is disposed on a side surface of the body 11 and moved along the lengthwise direction of the body 11 in a reciprocating manner as indicated in white arrows in the drawings, a rectangular opening 13 formed in a side surface of the body 11 to correspond to a moving path of the slider 12, and a dust seal band 14 provided on the body 11 to cover the opening 13.

The body 11 includes, in the inside thereof, a rail 15 that has a substantially H-shaped cross-section and extends along the lengthwise direction of the body 11, a guide 16 that has a substantially U-shaped cross-section and is engaged with the rail 15, and a motor (not illustrated) that drives the guide 16 along the rail 15 through a belt 17. The guide 16 has a bearing (not illustrated) buried in a surface opposite to the rail 15 and slides on the rail 15 by the bearing 15.

The guide 16 is joined to the slider 12 through a bracket 18 having a substantially annular cross-section. The bracket 18 is disposed to wrap the dust seal band 14 in the opening 13, and the cross-sectional shape of the guide 16 is exposed from the inside of the body 11 to the outside of the body 11 through the clearances 19 between the body 11 and the dust seal band 14. In addition, the bracket 18 is maintained in a contactless state in relation to the body 11 and the dust seal band 14. As a result, when the bracket 18 is moved along the lengthwise direction of the body 11, the bracket 18 may be moved without interfering with either the body 11 or the dust seal band 14 even though the dust seal band 14 exists in the opening 13.

In addition, the slider 12 has a plurality of screw holes 20 formed in a surface opposite to the body 11 side. A member to be attached, for example, the base portion of the conveyance arm is attached to the slider 12 by screwing a clamping screw to each of the screw holes 20. In addition, in the electric actuator 10, when the guide 16 is moved along the rail 15 by being driven by the motor, the guide 16 is moved together with the bracket 18 and the slider 12. Accordingly, the electric actuator 10 may move the member attached to the slider 12 along the lengthwise direction of the body 11.

Further, the electric actuator 10 includes a pair of electrodes 21 that protrude from the body 11 to the outside of the body 11 at the opposite sides of the opening 13. The pair of electrodes 21 is composed of a lower electrode 21*a* of a curved plate shape having an L-shaped cross-section, and an upper electrode 21*b* of a curved plate shape having a cross-section which is mirror-symmetrical to the cross-section of the lower electrode 21*a*. Both the lower electrode 21*a* and the upper electrode 21*b* extend along the lengthwise direction of the body 11. Also, the lower and upper electrodes 21*a*, 21*b* respectively have bottom portions 21*aa*, 21*ba* thereof fixed to the body 11 and planar lateral portions 21*ab*, 21*bb* thereof protrude from the body 11 to be parallel to each other with the opening 13 being interposed therebetween.

The lower and upper electrodes 21*a*, 21*b* are electrically connected through a direct current (DC) power supply 22 therebetween so that potentials of different poles are generated in the lower and upper electrodes 21*a*, 21*b*. In the present exemplary embodiment, the lower electrode 21*a* is connected to the negative pole of the DC power supply 22 and the upper electrode 21*b* is connected to the positive pole of the DC power supply 22. Therefore, negative potential is generated in the lower electrode 21*a* and positive potential is generated in the upper electrode 21*b*.

In the electric actuator 10, when the guide 16 is moved along the rail 15, a bearing rubs against a surface of the rail 15, thereby generating particles P. Because such particles P are charged with static electricity generated by friction, they typically have a negative or positive electric charge. When the size of the particles P is reduced, Brownian movement becomes more predominant than free fall motion caused by gravity in the movement of the particles P. Therefore, the particles P may be freely moved in the inside of the body 11 and may be released to the outside of the body 11 through the clearances 19.

However, because the released particles P have a negative or positive electric charge, the particles P receive an attraction force by electrostatic force from one of the lower electrode 21*a* and the upper electrode 21*b* and a repulsive force by electrostatic force from the other of the lower electrode 21*a* and the upper electrode 21*b*.

The inventor calculated, by simulation, the moving velocity by gravity, a moving velocity by Brownian movement, and a moving velocity by electrostatic force which were generated in a particle P having a monovalent charge in a case where the pressure between the lower electrode 21*a* and the upper electrode 21*b* was set to 10 Pa, the spacing between the lower electrode 21*a* and the upper electrode 21*b* was set to 30 mm, and the potential difference between the lower electrode 21*a* and the upper electrode 21*b* was set to 24V. The results are indicated in the graph of FIG. 2.

Figure 2:
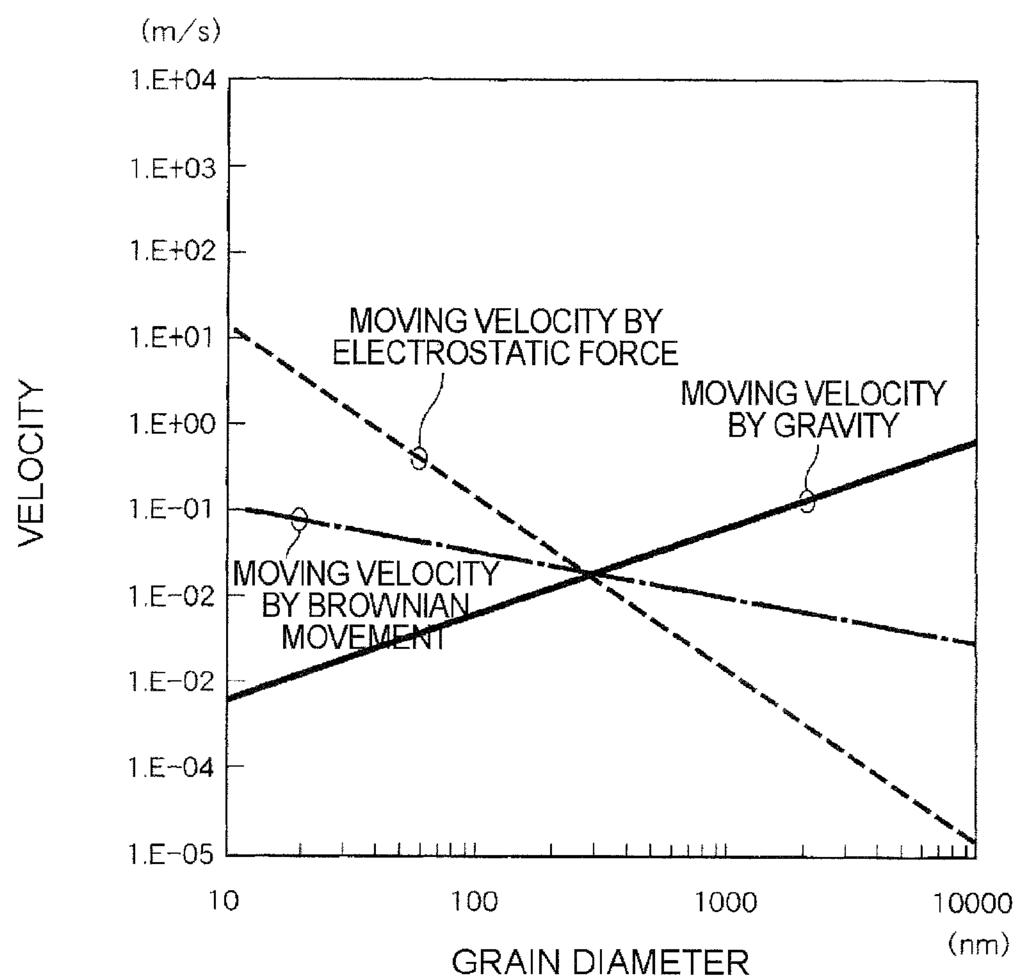
FIG. 2 is a graph representing respective moving velocities occurring at respective particles which have been calculated through a simulation under a given condition.

FIG. 2 is a graph representing respective moving velocities generated in the particles calculated by simulation under a given condition.

In the graph of FIG. 2, the vertical axis represents a moving velocity and the horizontal axis represents a grain diameter of a particle P. In addition, the solid line represents a moving velocity by gravity, the alternated long and short dash line represents a moving velocity by Brownian movement, and the broken line represents a moving velocity by electrostatic force.

As illustrated in the graph of FIG. 2, it has been confirmed that, when the grain diameters of particles P are 300 nm or less, the moving velocity by electrostatic force exceeds the moving velocity by gravity or the moving velocity by Brownian movement. That is, it has been confirmed that, when the grain diameters of the particles P become smaller, the movement by the electrostatic force is more prominent than the free falling motion or the Brownian movement in movement of the particles P.

Figure 3:
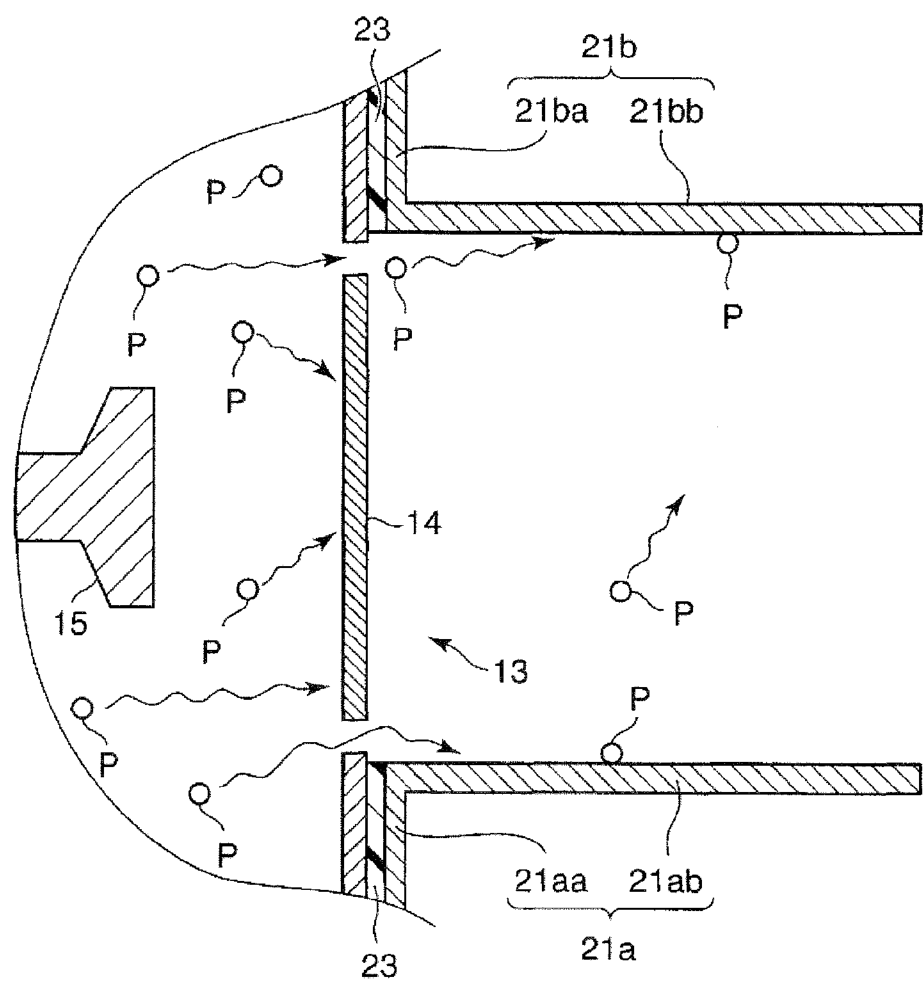
FIG. 3 is a view for describing a state in which particles released to the outside of a body through clearances between the body and a dust seal band are being adsorbed to a lateral portion or a lower electrode and a lateral portion of an upper electrode by electrostatic force.

Accordingly, under a given condition, a particle P having a grain diameter of, for example, 300 nm or less, is attracted to the lateral portion 21*ab* of the lower electrode 21*a* or the lateral surface 21*bb* of the upper electrode 21*b* by the electrostatic force, as illustrated in FIG. 3.

However, even if a released particle P having a negative or positive charge was attracted to the lateral portion 21*ab* or the lateral portion 21*bb* by electrostatic force, the particle P continues the movement toward the outside of the body 11. Therefore, when the lateral portion 21*ab* or the lateral portion 21*bb* is short (when the protrusion amount is small), the particle P may be released from the space interposed between the lateral portion 21*ab* and the lateral portion 21*bb* before it arrives at the lateral portion 21*ab* of the lower electrode 21*a* or the lateral portion 21*bb* of the upper electrode 21*b*.

In order to cope with this situation, it is desirable to increase the length (to increase the protrusion amount) of the lateral portion 21*ab* or the lateral portion 21*bb*. In addition, at least the lateral portion 21*ab* or the lateral portion 21*bb* may also be set to be longer than the width of the opening 13 (the vertical width in FIG. 3). In this manner, the particles P with a negative or positive charge may be suppressed from being released from the space between the lateral portion 21*ab* and the lateral portion 21*bb* prior to arriving at the lateral portion 21*ab* or the lateral portion 21*bb*.

Elements that constitute the lower electrode 21*a* and the upper electrodes 21*b* may be made of a conductive material. However, because a corrosive gas contained in the processing gas may be volatilized from the wafer while the wafer is being conveyed, it is desirable to cover the elements that constitute the lower electrode 21*a* and the upper electrode 21*b* with, for example, a resin-based coating.

In addition, in order to ensure that the particles P are adsorbed to the lateral portion 21*ab* or the lateral portion 21*bb* by electrostatic force, it is desirable that the potential difference between the lower electrode 21*a* and the upper electrode 21*b* is set to be high. However, when the potential difference between the lower electrode 21*a* and the upper electrode 21*b* is high under a low pressure environment, abnormal discharge may occur between these electrodes 21*a*, 21*b*. Meanwhile, according to the Paschen's law, for example, the abnormal discharge does not occur under a low pressure environment where a small amount of nitrogen gas ($N_2$ gas) remains unless the potential difference exceeds 500 V. Accordingly, the potential difference between the lower electrodes 21*a* and the upper electrode 21*b* is preferably 500 V or less. In consideration of the electrostatic force acting on the particles P, it is desirable to maintain the potential difference at approximately scores of voltages.

Further, insulation members 23 are interposed between the lower electrode and 21*a* the body 11 and between the upper electrode 21*b* and the body 11, respectively. The insulation members 23 insulate either the lower electrode 21*a* or the upper electrode 21*b* from the body 11. Accordingly, no potential occurs in the body 11, the body 11 may be prevented from electrostatically adsorbing the particles P. The insulation member 23 may be made of, for example, a silicon rubber or a metal oxide film, and formed through a coating or a thermal spraying.

According to the electric actuator 10 as described above, the pair of electrodes 21 protrude from the body 11 at the opposite sides of the opening 13 formed in a lateral surface of the body 11 toward the outside of the body 11 and extend in the lengthwise direction of the body 11 with the opening 13 being interposed between the pair of electrodes 21. In addition, positive potential is generated in the upper electrode 21*b* and negative potential is generated in the lower electrode 21*a*. Therefore, a particle P having a negative or positive charge and released from the inside of the body 11 to the outside of the body 11 through the clearance 19 is adsorbed to an electrode having the potential of which the pole is opposite to that of the charge of the particle P (the lower electrode 21*a* or the upper electrode 21*b*) by electrostatic force. As a result, the particles P having a negative or positive charge may be suppressed from being released from the body 11.

As described above, because the particles P having a negative or positive charge are hardly scattered from the electric actuator 10, no particle P scattered from the electric actuator 10 falls by gravity to be adhered to a stock or a surface of a carried wafer below the electric actuator 10. As a result, a degree of freedom in arranging the electric actuator 10 may be improved.

Figure 4:
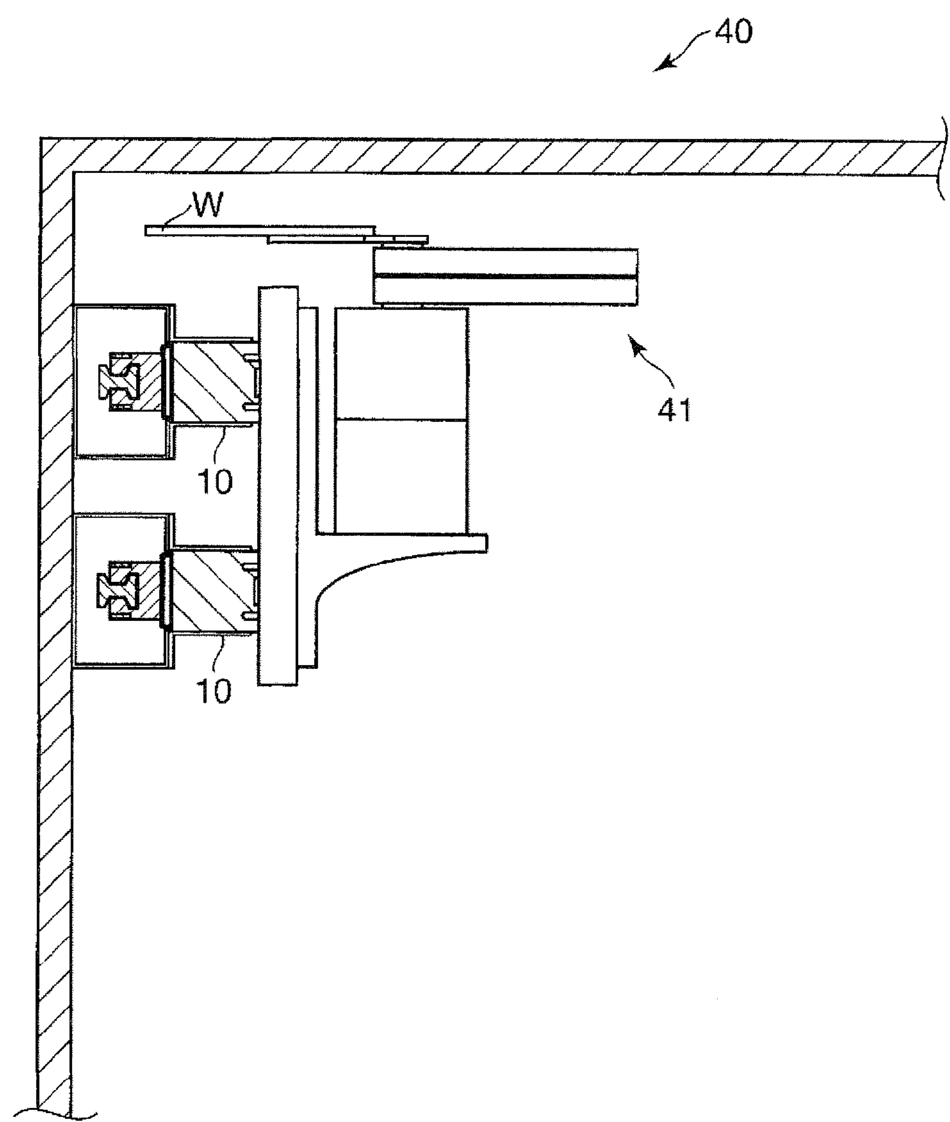
FIG. 4 is a view for describing a state in which the electric actuator of FIGS. 1A to 1C is arranged in a substrate conveyance chamber.

For example, the electric actuator 10 may be arranged at an upper side in a substrate conveyance chamber. Specifically, as illustrated in FIG. 4, in a transfer module 40 as a substrate conveyance chamber, two electric actuators 10 configured to move a scalar type conveyance arm 41 (a substrate conveyance apparatus) may be arranged at the upper side within the transfer module 40. Thus, a wafer W may be conveyed, flying over any other conveyance arm or a wafer buffer arranged at the lower side within the transfer module 40, which enables efficient conveyance of the wafer W. In addition, when increasing the number of wafer W conveyance routes within the transfer module 40, it is not required to arrange a plurality of conveyance arms only at the lower side within the transfer module 40. Thus, the increase of the installation area (foot print) of the transfer module 40 may be suppressed.

Figure 5A:
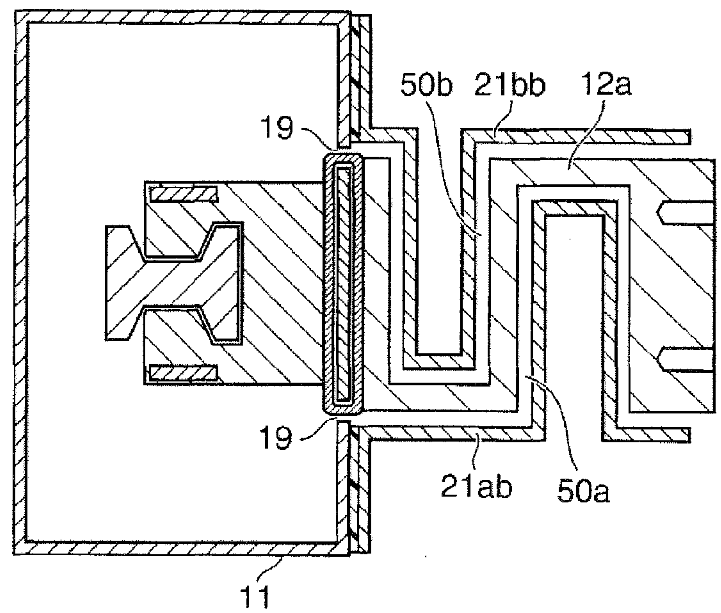
FIG. 5A is a cross-sectional view schematically illustrating a configuration of a first modified embodiment of the electric actuator of FIGS. 1A to 1C.

In the above-described electric actuator 10, either the lateral portion 21*ab* of the lower electrode 21*a* or the lateral portion 21*bb* of the upper electrode 21*b* has a simple planar shape. However, at least one of the lateral portion 21*ab* and the lateral portion 21*bb* may be curved. For example, as illustrated in FIG. 5A, a protrusion 12*a* that protrudes to the outside of the body 11 and has two curved locations may be formed on the slider 12 and the lateral portion 21*ab* of the lower electrode 21*a* and the lateral portion 21*bb* of the upper electrode 21*b* may be configured such that the lateral portion 21*ab* and the lateral portion 21*bb* are curved along the protrusion 12*a* so that the protrusion 12*a* is interposed between the lateral portion 21*ab* and the lateral portion 21*bb*. Therefore, curved paths 50*a*, 50*b* are respectively formed between the lateral portion 21*ab* of the lower electrode 21*a* and the protrusion 12*a* of the slider 12 and between the lateral portion 21*bb* of the upper electrode 21*b* and the protrusion 12*a* to extend from the opening 13 to the open end of the pair of the electrodes 21. Because the particle P released from the inside of the body 11 to the outside of the body 11 through the clearance 19 pass through the curved paths 50*a*, 50*b*, the particles P collide with the protrusion 12*a* or each of the lateral portions 21*ab*, 21*bb* at the curved locations in the curved paths 50*a*, 50*b*. As a result, the particles P stay within the curved paths 50*a*, 50*b* so that the particles P are suppressed from being released from the open end of the pair of electrode 21. In addition, the present modified embodiment makes the particles P stay within the curved paths 50*a*, 50*b* by the collision with a member, i.e. by a mechanical method. Therefore, the particles P may be suppressed from being released from the body 11 even if the particles P do not have a negative or positive charge.

Figure 5B:
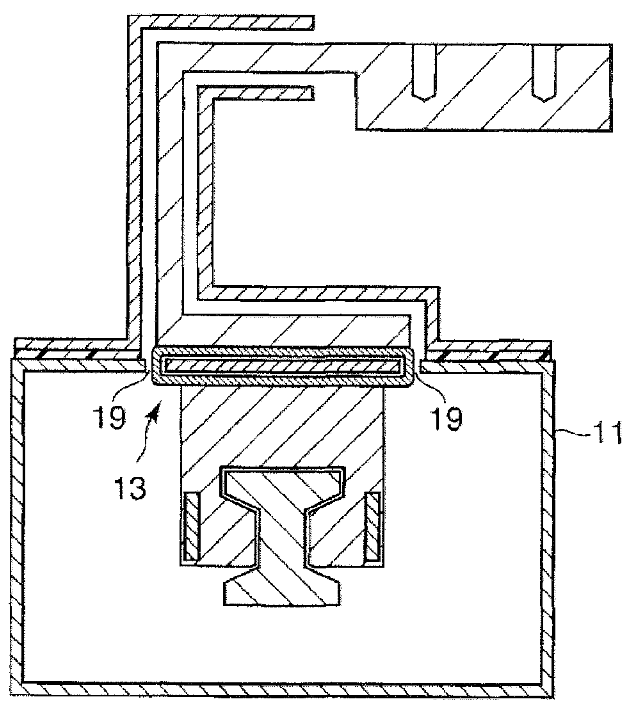
FIG. 5B is a cross-sectional view schematically illustrating a configuration of a second modified embodiment of the electric actuator of FIGS. 1A to 1C.

In the above-described electric actuator 10, the opening 13 of the body 11 is opened laterally. However, for example, as illustrated in FIG. 5B, the opening 13 may be opened upwardly. In such a case, gravity acts on the particles P released from the inside of the body 11 to the outside of the body 11 through the clearance 19 so that the particles P return to the inside of the body 11. As a result, it may be assured that the particles P are suppressed from being released from the body 11. In addition, because the present modified embodiment applies gravity to the particles P so that the particles P return to the inside of the body 11, the particles P may return to the inside of the body 11 even if the particles do not have a negative or positive charge.

Next, an electric actuator according to a second exemplary embodiment of the present disclosure will be described.

The present exemplary embodiment is basically the same as the first exemplary embodiment in configuration and functional action. Thus, descriptions on the overlapping configurations and functional actions will be omitted and different configurations and functional actions will be described below.

Figure 6:
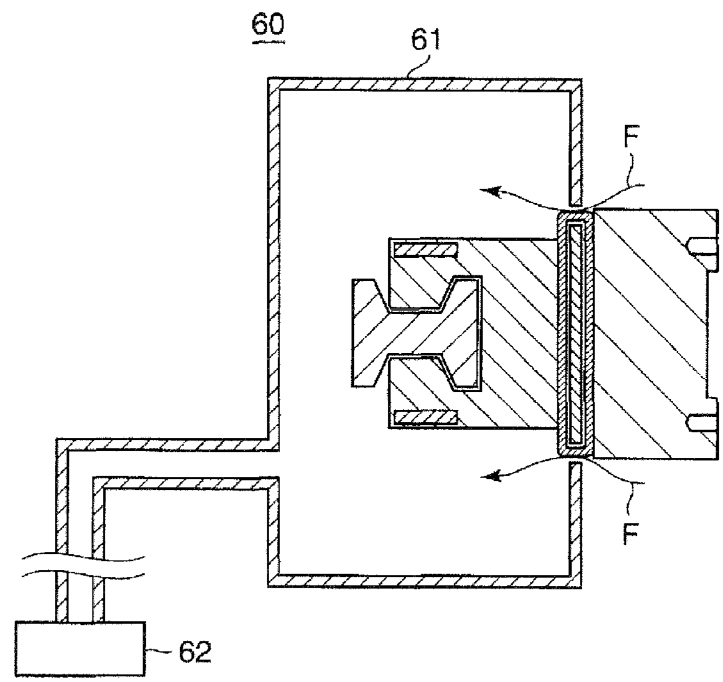
FIG. 6 is a cross-sectional view schematically illustrating a configuration of a conventional electric actuator provided with an exhaust apparatus.

Conventionally, when an electric actuator is used under an environment having a predetermined pressure or a higher pressure, for example, under an atmospheric pressure environment, particles are moved by being entrained into an air flow. Therefore, for example, as illustrated in FIG. 6, an exhaust apparatus 62 configured to decompress the inside of the body 61 of the electric actuator 60 is provided so that the internal pressure of the body 61 is set to be lower than the external pressure of the body 61. As a result, an airflow F flowing from the outside to the inside of the body 61 is generated and the particles are suppressed from being released from the inside to the outside of the body 61 by the air flow F.

When a processing gas containing a corrosive gas, for example, bromine gas, is used for processing a wafer, the corrosive gas may be volatilized from the wafer when the wafer is being conveyed in the substrate conveyance chamber using the electric actuator. In such a case, when the internal pressure of the body 61 is lower than the external pressure of the body 61, the corrosive gas may be sucked down into the inside of the body 61 and corrode the rail, the guide or the motor arranged in the inside of the body 61.

In the electric actuator according to the present exemplary embodiment, the internal pressure of the body is set to be higher than the external pressure of the body so as to cope with the above-described situation.

Figure 7:
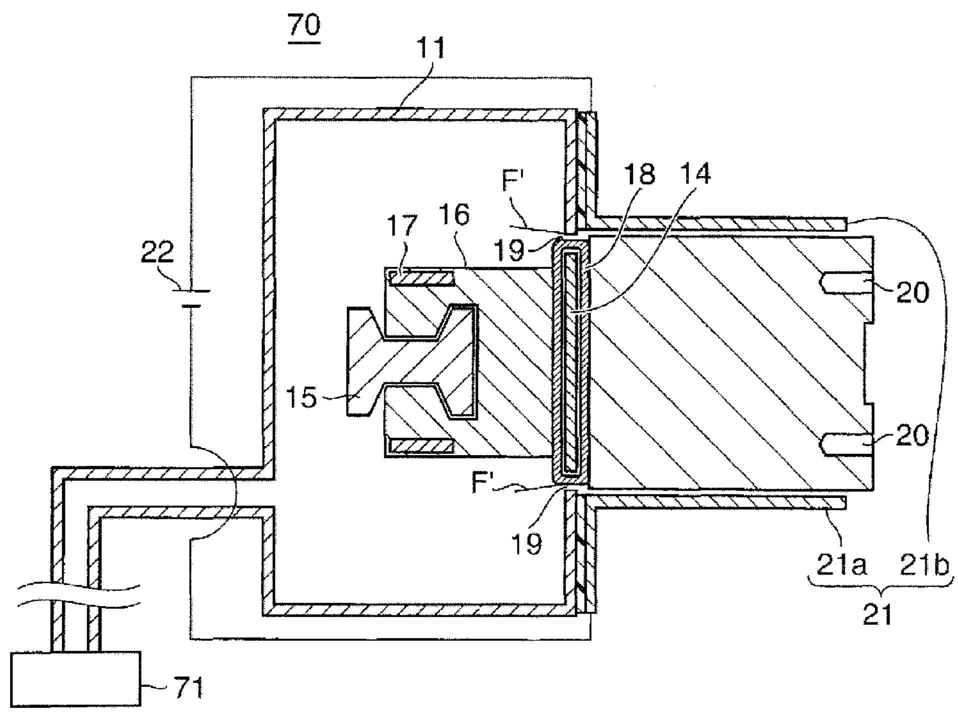
FIG. 7 is a cross-sectional view schematically illustrating a configuration of an electric actuator according to a second exemplary embodiment of the present disclosure.
Figure 8A:
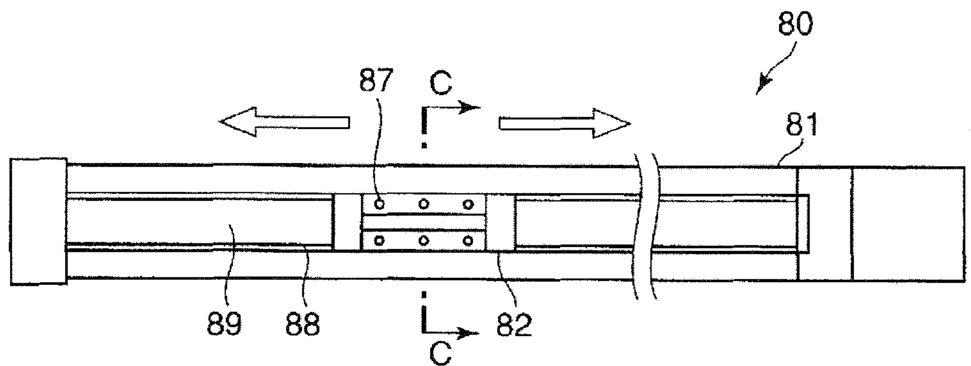
FIG. 8A is a front view schematically illustrating a configuration of a conventional electric actuator when viewed from the front side.
Figure 8B:
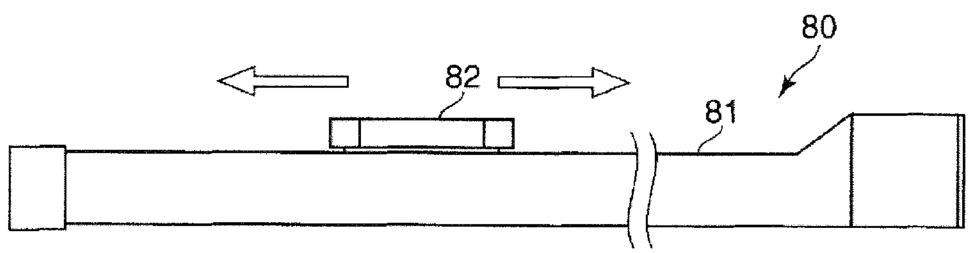
FIG. 8B is a bottom view schematically illustrating the configuration of the conventional electric actuator when viewed from the bottom side.
Figure 8C:
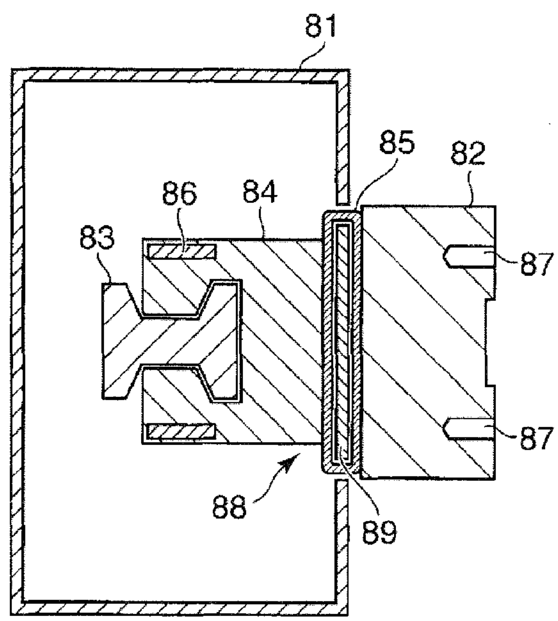
FIG. 8C is a cross-sectional view taken along line C-C in FIG. 8A in the configuration of the conventional electric actuator.
Figure 9:
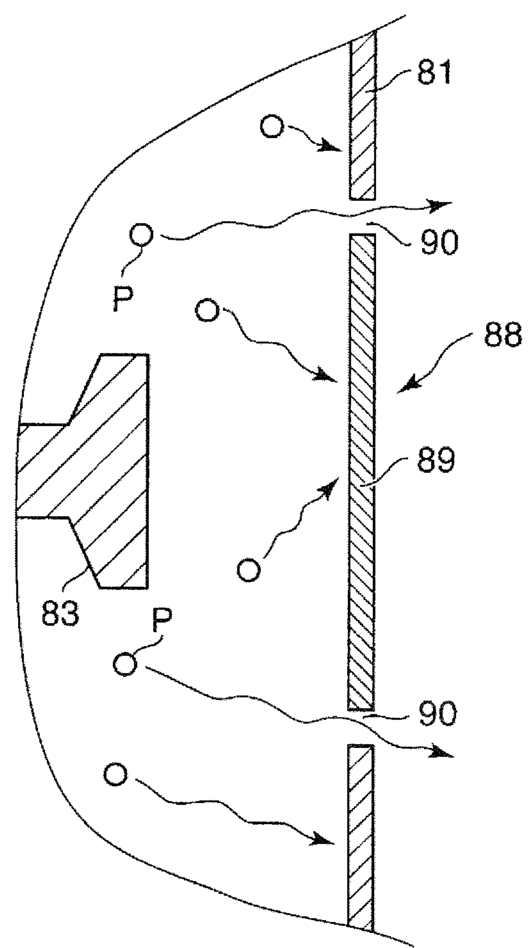
FIG. 9 is a view for describing a state in which particles are released to the outside of the body in the conventional electric actuator.

FIG. 7 is a cross-sectional view schematically illustrating the configuration of the electric actuator according to the present exemplary embodiment.

Referring to FIG. 7, the electric actuator 70 is provided with a pressure control apparatus 71 connected to the body 11. The pressure control apparatus 71 sends, for example, a gas to the inside of the body 11 so as to maintain the internal pressure of the body 11 to be higher than the outside pressure of the body 11 (external pressure). Thus, for example, the corrosive gas is not sucked down into the inside of the body 11 and the corrosion of the rail 15, the guide 15 or the motor arranged in the inside of the body 11 may be suppressed.

Meanwhile, when the internal pressure of the body 11 is maintained to be higher than the external pressure of the body 11, an air flow F' flowing from the inside to the outside of the body 11 is generated. The particles P generated in the inside of the body 11 may be released to the outside of the body 11 through the clearances 19 by the air flow F'. However, the released particles P having a negative or positive charge are attracted to the lateral portion 21*ab* of the lower electrode 21*a* or the lateral portion 21*bb* of the upper electrode 21*b* by electrostatic force. That is, according to the electric actuator 70 as described above, the corrosive gas may be suppressed from being sucked down into the inside of the body 11 and the particles P having a negative or positive charge may be suppressed from being released from the body 11.

In the electric actuator 70, any gas may be sent to the inside of the body 11 from the pressure control apparatus 71 as long as it is not corrosive and a dry gas formed of, for example, an inert gas, is preferable.

Meanwhile, as in the modified embodiments of the first exemplary embodiment as illustrated in FIGS. 5A and 5B, the electric actuator 70 may also be formed with a protrusion 12*a* on the slider 12 and the lateral portion 21*ab* of the lower electrode 21*a* and the lateral portion 21*bb* of the upper electrode 21*b* may be formed to be curved along the protrusion 12*a* so as to form the curved paths 50*a*, 50*b*. In addition, the opening 13 may be opened upwardly.

Although the present disclosure has been described with reference to respective exemplary embodiments above, the present disclosure is not limited to the respective exemplary embodiments.

DESCRIPTION OF SYMBOLS

P: particle
W: wafer
10: electric actuator

11: body
12: slider
12*a*: protrusion
13: opening
19: clearance
21: a pair of electrode
21*a*: lower electrode
21*b*: upper electrode
21*ab*, 21*bb*: lateral portion
22: direct current power supply
23: insulation member
41: conveyance arm
50*a*, 50*b*: curved path
71: pressure control apparatus

What is claimed is:

1. An electric actuator comprising:

a body made of an elongated enclosure;

a base portion configured to move in a reciprocating manner along a lengthwise direction of the body;

an opening formed in a side surface of the body to correspond to a moving path of the base portion;

a seal member provided to cover the opening; and a pair of electrodes protruding from the body toward the outside of the body at opposite sides of the opening and extending in the lengthwise direction of the body with the opening being interposed between the pair of electrodes, wherein positive potential is generated in one of the pair of electrodes and negative potential is generated in the other of the pair of electrodes.

2. The electric actuator of claim 1, wherein the body has an internal pressure that is maintained to be higher than an external pressure of the body.

3. The electric actuator of claim 1, wherein the base portion has a protrusion that protrudes to the outside of the body and has at least one curved location, and the pair of electrodes are curved along the protrusion with the protrusion being interposed therebetween.

4. The electric actuator of claim 1, wherein the opening is opened upwardly.

5. The electric actuator of claim 1, wherein a substrate conveyance apparatus configured to convey a substrate is attached to the base portion.

6. The electric actuator of claim 1, wherein an insulation member is interposed between the pair of electrodes and the body and the pair of electrodes are electrically insulated from the body.

7. The electric actuator of claim 1, wherein the seal member is a seal band.

* * * * *